United States Patent
Miura et al.

(10) Patent No.: US 7,449,906 B2
(45) Date of Patent: Nov. 11, 2008

(54) PROBE FOR TESTING AN ELECTRICAL DEVICE

(75) Inventors: Kiyotoshi Miura, Aomori (JP); Yuji Miyagi, Aomori (JP); Akihisa Akahira, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 10/556,436

(22) PCT Filed: Aug. 29, 2003

(86) PCT No.: PCT/JP03/11117

§ 371 (c)(1),
(2), (4) Date: Nov. 13, 2006

(87) PCT Pub. No.: WO2004/102207

PCT Pub. Date: Nov. 25, 2004

(65) Prior Publication Data

US 2007/0216433 A1    Sep. 20, 2007

(30) Foreign Application Priority Data

May 13, 2003    (JP) .............................. 2003-134753

(51) Int. Cl.
G01R 31/02    (2006.01)
(52) U.S. Cl. ..................... 324/761; 324/762; 324/754
(58) Field of Classification Search .................. None
See application file for complete search history.

(56) References Cited

U.S. PATENT DOCUMENTS

| 3,648,169 | A | * | 3/1972 | Wiesler ..................... 324/762 |
| 4,034,293 | A | | 7/1977 | Roch |
| 5,286,208 | A | * | 2/1994 | Matsuoka ..................... 439/72 |
| 5,599,194 | A | * | 2/1997 | Ozawa et al. ................. 439/72 |
| 6,504,388 | B2 | | 1/2003 | Comulada, Jr. et al. |
| 6,794,890 | B1 | * | 9/2004 | Tokumo et al. ............. 324/761 |

FOREIGN PATENT DOCUMENTS

| CN | 2278836 Y | 4/1998 |
| CN | 1359470 A | 7/2002 |
| EP | 0511763 A2 | 1/1997 |
| JP | 05-094856 | 2/1991 |
| JP | 5-94856 | 4/1993 |
| JP | 07115110 | 2/1995 |
| JP | 1998-032242 | 7/1998 |
| JP | 10-270140 | 10/1998 |
| JP | 11-133060 | 5/1999 |
| JP | 2000-193681 | 7/2000 |
| JP | 2002-004005 | 1/2002 |
| JP | 2003-057264 | 2/2003 |

* cited by examiner

*Primary Examiner*—Minh N Tang
(74) *Attorney, Agent, or Firm*—Michael Fedrick; Robert J. Rose; Sheldon Mak Rose & Anderson

(57) ABSTRACT

A probe having a first and a second arm portion extending between first and second connecting portions connecting the first and second arm portions respectively at their front end portion and base end portion, and a needle point portion below the first connecting portion. At least one of the entire first and second arm portions or the upper or lower edge portions of the first and second arm portions are arcuate.

15 Claims, 14 Drawing Sheets

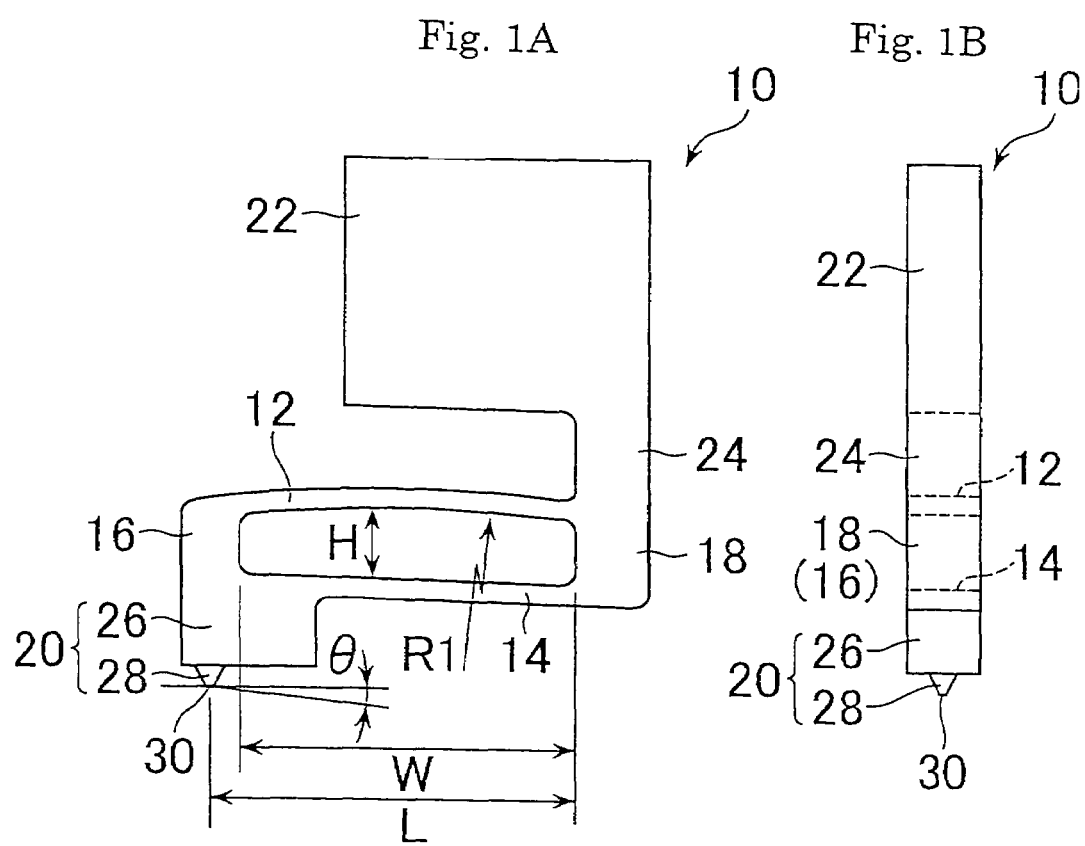

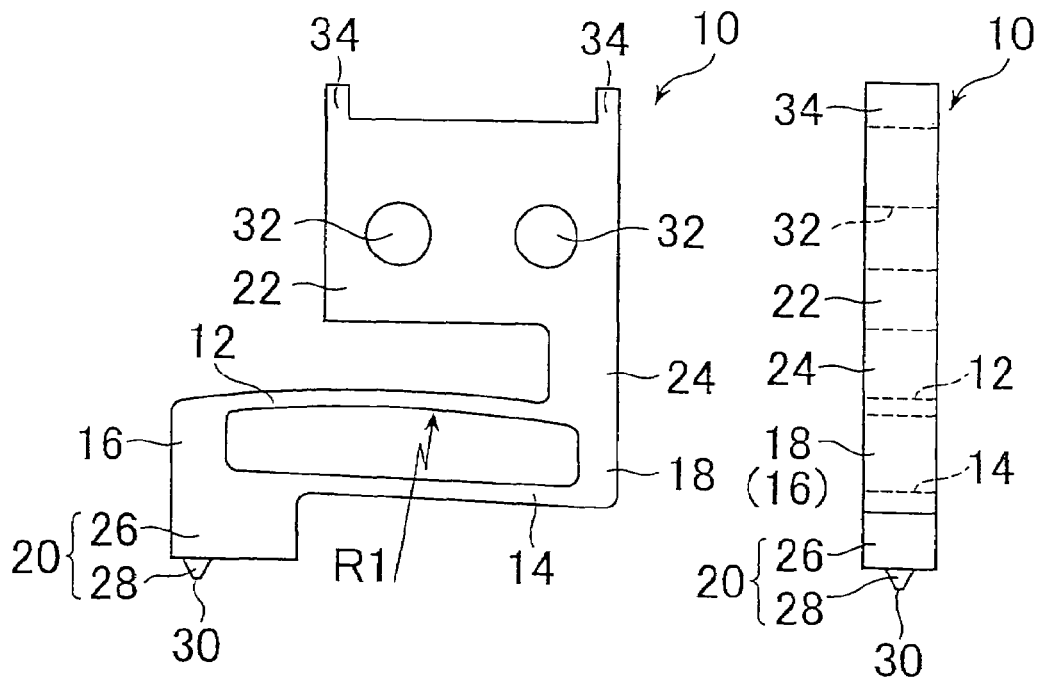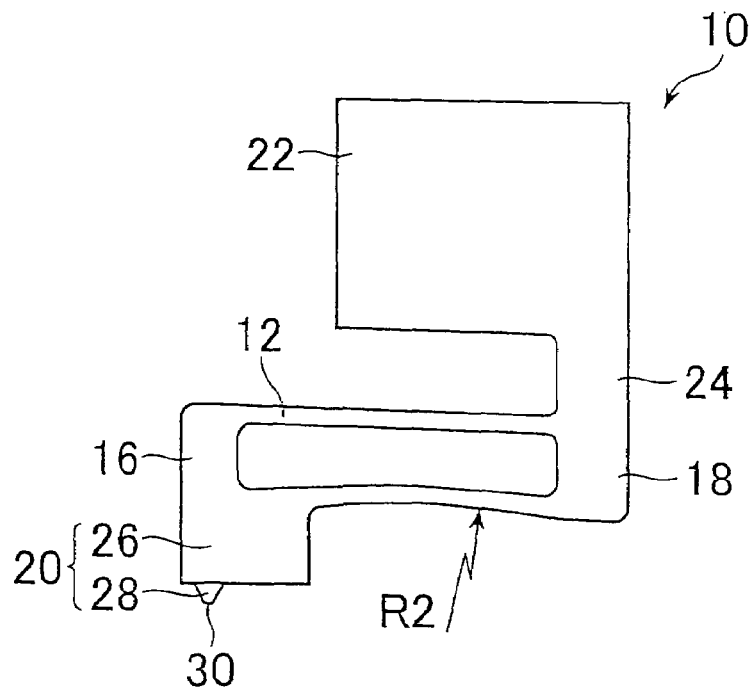

PROBE FOR TESTING AN ELECTRICAL DEVICE

CROSS-REFERENCE TO RELATED APPLICATION

This Application claims priority from International Application Number PCT/JP2003/11117, titled "Probe for Electric Test," filed Aug. 29, 2003, and from Japanese Application Number 2003-134753, filed May 13, 2003.

FIELD OF ART

The present invention relates to a probe for use in electric test of a flat plate-like device under test such as a semiconductor integrated circuit.

BACKGROUND ART

A flat plate-like device under test such as a semiconductor integrated circuit is subjected to an electric test as to whether or not it is produced as per specification. This kind of electric test is conducted by using an electric connecting apparatus such as a probe card, a probe block, a probe unit or the like provided with a plurality of probes to be individually pressed against an electrode of the device under test. The electric connecting apparatus of this kind is used for electrically connecting the electrode of a device under test and a tester.

As probes for use in such an electric connecting apparatus, there are a needle type one produced from a conductive metal fine wire, a blade type one formed like a plate, and a probe element type one using a probe element which, forms a projected electrode in wiring formed on one face of an electrically insulated sheet (film).

The blade type probe includes a single plate type one produced from a conductive metal plate, and a lamination type one in which exposure and etching of a photoresist and plating its etched portion are made one or more times.

The probe of either type is supported in a cantilever-like manner on a support member such as a wiring plate with its needle point pressed against an electrode of a device under test. When the needle point is pressed against the electrode of the device under test, an over drive acts on the probe, which is curved by elastic deformation.

As one of the blade type probes, there is a Z-shaped one comprising: a first and a second arm portions extending in a second direction at an interval in a first direction; a first and a second connecting portions for connecting the first and second arm portions at their front end portions and base end portions; a needle point portion following one side in the first direction of the first connecting portion; and a mounting portion following the other side in the first direction of the second connecting portion (FIG. 1 of Japanese Patent Appln. Public Disclosure (KOKAI) No. 7-115110).

As another one of the blade type probes, there is one comprising: a first and a second arm portions extending in a second direction at an interval in a first direction; a connecting portion for connecting the first and second arm portions at their base end portions; a needle point portion following one side in the first direction of the front end portion of the first arm portion; and a mounting portion following the other side in the first direction of the front end portion of the second arm portion (FIG. 2 of Japanese Patent Appln. Public Disclosure (KOKAI) No. 2003-57264).

In each of the conventional probes, the mounting portion is attached to a proper support member and supported in a cantilever-like manner on the support member with its needle point pressed, in that state, against the electrode of the device under test. Thereby, the over drive acts on the probe, and the probe is curved by elastic deformation in the first and second arm portions.

In both these conventional probes, however, the first and second arm portions only extend in parallel to each other in the second direction which is diagonal to the first direction, so that, if an over drive amount is increased to greatly elastically deform the first and second arm portions, breaking occurs at least in one of the first and second arm portions.

Particularly, in case of a microprobe for an integrated circuit, the cross sectional areas of the first and second arm portions are remarkably small, so that a first and a second mechanical strengths are weak, and it is difficult to increase the over drive amount and elastically deform the first and second arm portions to a great extent.

Unless the over drive amount can be increased as mentioned above, pressing force (needle pressure) of the needle point against the electrode of the device under test cannot be increased, so that a good electrical connection between the electrode of the device under test and the needle point cannot be realized and the position of the needle point in the first direction should be coincided highly accurately. As a result, an accurate test cannot be expected.

DISCLOSURE OF THE INVENTION

An object of the present invention lies in making an over drive amount great to make the first and second arm portions greatly elastically deformable.

The probe according to the present invention comprises: a first and a second arm portions extending in a second direction at an interval in a first direction; a first and a second connecting portions for connecting the first and second arm portions at their front end portions and base end portions to each other; and a needle point portion following one side in the first direction of the first connecting portion or the second arm portion. In at least one of the first and second arm portions, at least one of the entire arm portion, one of edge portions in the first direction of the arm portion, and an edge portion the other side in the first direction of the arm portion is made arcuate.

The above-mentioned probe is supported in a cantilever manner at a support member on the side of the second connecting portion which connects the base end portions of the first and second arm portions, and the needle point is pressed against the electrode of the device under test in that state. When the needle point is pressed against the electrode, the over drive acts on the probe, whereby the first and second arm portions are elastically deformed to be curved.

In the above-mentioned probe, however, at least one of the first and second arm portions has at least one arcuate part, thereby increasing the mechanical strength of the first or the second arm portion having such an arcuate part. For this reason, even if a great over drive acts on the probe, both arm portions are elastically deformed and curved without causing a break in the first and second arm portions.

As a result, since the pressure of the needle point (needle pressure) against the electrode of the device under test can be increased by making the over drive amount great, it is possible to render the electrode of the device under test and the needle point in a state of good electrical connection, and to bring the electrode of the device under test and the needle point surely into contact without making the position of the needle point in the first direction coincide with a high accuracy, thereby enabling to carry out an accurate test.

The probe can further comprise a mounting portion located on the other side in the first direction relative to the first and second arm portions and an extended portion extending from the mounting portion to the one side in the first direction and following the second connecting portion. By this, the probe can be supported at the support member in the mounting portion.

The probe may have a shape of a plate whose thickness direction is a direction intersecting the first and second directions.

The mounting portion can have a hole penetrating in its thickness direction. By this, the through hole can be used as a positioning hole, thereby facilitating a work for mounting the probe on the support member.

The probe can further comprise a projection extending from the mounting portion toward the other side in the first direction. Thereby, by forming a hole for fitting the projection in the support member and inserting the projection into the fitting hole, positioning of the probe relative to the support member is carried out, thereby further facilitating the mounting work of the probe to the support member.

The needle point can comprise a pedestal portion following the first connecting portion and the first or second arm portion as well as a contact portion projecting from the one side in the first direction of the pedestal portion.

The contact portion may be made of a material different at least from that of the pedestal portion. The pedestal portion may be made of the same material as that of at least the first and second arm portions and the first and second connecting portions.

The contact portion may have a front end face which makes an angle from 0.1° to 5° to the second direction and of which a part nearer the side in the second connecting portion is nearer the side of the first connecting portion in the first direction.

The probe can further comprise a reference portion formed at a position different from the needle point of the needle point portion. By this, when positioning relative to a prober or the device under test, by picking-up image of the probe by an area sensor from the needle point side (the device under test side), and picture processing an output signal of the area sensor, the position of each probe can be obtained as a coordinate position of the needle point within a image picking-up region of the area sensor. As a result, since the probe has the reference portion formed at a position different from that of the needle point, the reference portion can easily identify from surroundings by using the output sensor of the area sensor, thereby easily determining the coordinate position of the reference portion, too. Also, since the positional relation between the reference portion and the needle point is constant, the position of the needle point can be easily determined from the position of the reference portion.

The reference portion can have a light reflection property in the first direction different from at least a part of a region next thereto. By this, the reference portion can be identified by using a difference in a reflected light amount in the other direction.

It is possible that the probe further comprises a projected portion projecting in the second direction from one of the needle point portion and the second arm portion, the projected portion has at least one inclined plane portion inclined to the axis of the projected portion and a flat plane portion following the front end of the inclined plane portion and perpendicular to the axis and retreated toward the arm portion side than to the needle point, and the reference portion is made the flat plane portion.

The projected portion may be projected from the needle point portion or the second arm portion. The reference portion can include a region enclosed by a surrounding region different in the light reflection property in the first direction.

The probe can further comprise at least one recess formed at the needle point portion, and a conductive coat formed in the recess and the needle point of the needle point portion. By this, wear of the needle point can be reduced by making the coat of a harder material and another portion such as the needle point. Also, since a coat is formed in the recess, too, even if the needle point portion slides against the electrode in a state of being pressed against the electrode due to an over drive at the time of an electric test, the coat can be prevented from peeling off the needle point portion.

BRIEF DESCRIPTION OF THE DRAWINGS

FIGS. 1A and 1B are views showing a first embodiment of the probe according to the present invention, wherein FIG. 1A is a front elevation and FIG. 1B a right side view.

FIGS. 2A and 2B are views showing a second embodiment of the probe according to the present invention, wherein FIG. 2A is a front elevation and FIG. 2B a right side view.

FIG. 3 is a front elevation showing a third embodiment of the probe according to the present invention.

FIGS. 8A and 8B are perspective views showing one example of a method of mounting the contact portion on the pedestal, wherein FIG. 8A shows a state before mounting and FIG. 8B a state after mounting.

FIGS. 9A and 9B are views showing an eighth embodiment of the probe according to the present invention, wherein FIG. 9A is a front elevation and FIG. 9B a right side view.

FIGS. 10A, 10B, 10C, 10D, 10E and 10F are views for explaining a method of producing the probe shown in FIGS. 9A and 9B, wherein FIGS. 10A and 10B are respectively a vertical section and a plan view in a first step, FIGS. 10C and 10D are respectively a vertical section and a plan view in a second step, and FIGS. 10E and 10F are respectively a vertical section and a plan view in a third step.

FIGS. 13A and 13B are views showing an eleventh embodiment of the probe according to the present invention, wherein FIG. 13A is a front elevation and FIG. 13B a bottom view.

FIGS. 14A and 14B are views showing a twelfth embodiment of the probe according to the present invention, wherein FIG. 14A is a front elevation of the needle point portion and FIG. 14B a bottom view of the needle point portion.

THE BEST MODE FOR WORKING THE INVENTION

Figure 4:
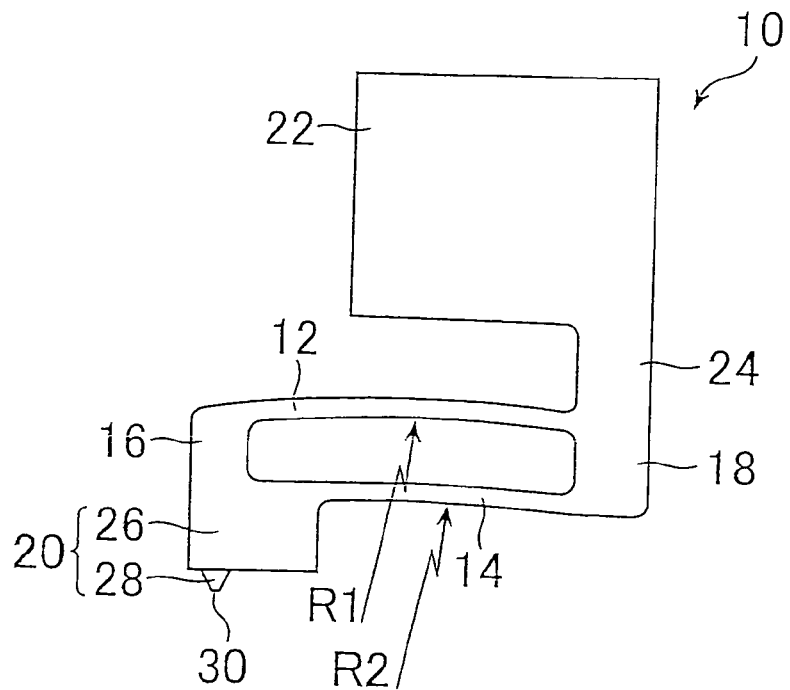
FIG. 4 is a front elevation showing a fourth embodiment of the probe according to the present invention.

Hereinafter, in FIG. 1A, it is defined that the upward and downward direction is the first direction, the rightward and leftward direction the second direction, and the direction perpendicular to the surface of the paper the third direction, but those directions differ according to a chuck top of the prober which receives a device under test to be excited.

Referring to FIGS. 1A and 1B, the probe 10 includes: a first and a second arm portions 12, 14 extending in the second direction (rightward and leftward) at an interval in the first direction (upward and downward); a first and a second connecting portions 16, 18 for connecting the first and second arm portions 12, 14 at their front end and base end portions; a needle point portion 20 following one side (lower edge side) in the first direction of the first connecting portion 16; a mounting portion 22 located on the other side (upper edge side) in the first direction to the first and second arm portions 12, 14; and an extended portion 24 extending toward one side in the first direction from the mounting portion 22 and following the second connecting portion 18.

The needle point portion 20 is provided with a pedestal portion 26 integrally following the lower edge portion of the first connecting portion 16 and the lower edge portion on the front end side of the second arm portion 14, and a contact portion 28 projecting from the lower edge portion of the pedestal portion 26.

The arm portions 12, 14, the first and second connecting portions 16, 18, the mounting portion 22, the extended portion 24 and the pedestal portion 26 are shaped as an integral plate having substantially the same thickness dimension, so that the probe 10 is made a generally flat blade-type probe.

On the other hand, the contact portion 28 has a truncated conical or truncated pyramidal shape, and is integrally formed on the underside of the pedestal portion 26 at corresponding parts of the bottom face of such a conical or pyramidal shape.

The contact portion 28 has a front end face having an angle θ from 0.1° to 5° to an imaginary horizontal plane which is perpendicular to the upward and downward direction. In the illustration, this front end face acts as a needle point 30 to be pressed against the electrode of the device under test.

The needle point (front end face) 30 is an inclined plane in which the side (front end side) of the first connecting portion 16 in the rightward and leftward direction is the upper side. The needle point 30 may, however, be made a horizontal plane perpendicular to the upward and downward direction, or a hemispherical plane. Also, the needle point 30 may be an acute needle point instead of a plane.

The first arm portion 12 is generally made arcuate having a proper radius of curvature R1 and projecting upward. The radius of curvature R1 may have a value corresponding to an interval H between the arms 12 and 14 in the upward and downward direction, an interval W between the connecting portions 16 and 18 in the rightward and leftward direction, and a distance (effective length of the arm portion) L from the second connecting portion 18 to the center of the contact portion 28, as well as corresponding to a slipping amount of both when the needle point 30 is pressed against the electrode of the device under test.

As a material of the probe 10 can be given a conductive metal material such as an alloy of nickel and phosphor (Ni—P), an alloy of nickel and tungsten (Ni—W), rhodium (Rh), phosphor bronze (BeCu), nickel (Ni), an alloy of palladium and cobalt (Pd—Co), and an alloy of palladium, nickel and cobalt (Pd—Ni—Co) or the like.

The probe 10 may be entirely made of the above-mentioned material. The contact portion 28, however, may be made of a different material at least from that of the pedestal portion 26. In this case, the pedestal portion 26 may be made of the same material as those of both arm portions 12, 14, both connecting portions 16, 18, the mounting portion 22 and the extended portion 24, or different material therefrom.

Production of the probe 10 is facilitated if the probe 10 is made of the same material in its entirety or generally except the contact portion 28.

The probe 10 is assembled into an electric connecting apparatus 80 such as a probe card, as shown in FIGS. 15 through 19 described later. The electric connecting apparatus 80 is detailed later, but is briefly explained in the following.

The electric connecting apparatus 80 has a circular wiring plate 82 connected to a tester, a circular reinforcing plate 84 disposed on the top face of the wiring plate 82, and a ring 86 disposed on the underside of the wiring plate 82 attached coaxially in an overlapped state with a plurality of bolts 88. A circular connection plate 90 and a mounting plate 92 are disposed inside the ring 86 and on the lower side of the wiring plate 82.

The wiring plate 82, ring 86, connection plate 90 and mounting plate 92 act as support members, i.e., support plates of the probe 10. A device under test 94 like an integrated circuit on a semiconductor wafer is disposed and supported horizontally on a chuck top 96 of an inspection stage.

The probe 10 is supported at the mounting portion 22 in a cantilever manner on the mounting plate 92, and is pressed in that state against the electrode of the device under test 94. When the needle point 30 is pressed against the electrode of the device under test 94, the over drive acts on the probe 10 to cause both arm portions 12, 14 to be elastically deformed and curved.

In the probe 10, however, since the first arm portion 12 is generally curved to be arcuate, mechanical strength of the arcuate first arm portion 12 is increased. For this reason, even if a great over drive acts on the probe 10, both arm portions 12, 14 are elastically deformed and curved without breaking.

As a result, since the pressure (needle pressure) of the needle point 30 against the electrode of the device under test 94 can be increased by making the over drive amount greater, a favorable electric connection between the electrode of the device under test 94 and the needle point 30 can be achieved.

Also, to conduct an electric test of the device under test 94, a plurality of probes 10 having such a structure as mentioned above are attached to the support member (in particular, the mounting plate 92). In this case, even if the positions of the needle points 30 in the upward and downward direction of adjoining probes 10 do not coincide with high accuracy, it is possible to conduct accurate inspection by increasing the over drive amount to elastically deform the probes to become the greater, the nearer the electrode of the device under test 94, and bringing the electrode of the device under test 94 and the needle points 30 surely into contact.

Referring to FIGS. 2A and 2B, the mounting portion 22 may have holes 32 penetrating in its thickness direction at a plurality of positions at intervals in the rightward and leftward direction, or may form projections 34 extending upward from the mounting portion 22 at a plurality of positions at intervals in the rightward and leftward direction.

According to the probe 10 having holes 32 in the mounting portion 22, the holes 32 can be used as positioning holes of the probes 10 relative to the mounting plate 92, thereby facilitating a work for mounting the probes 10 on the mounting plate 92.

Also, according to the probe 10 having projections 34 extending upward from the mounting portion 22, probes 10 are positioned relative to the mounting plate 92 by forming holes for fitting projections in the mounting plate 92 and inserting the projections 34 in the fitting holes, thereby facilitating mounting work of the probes 10 on the mounting plate 92.

As shown in FIG. 3, in place of curving the first arm 12 into an arc shape, the second arm portion 14 may be curved into an arc shape which projects upward with a proper radius of curvature R2. By this, since the mechanical strength of the second arm portion 14 becomes greater, even if a great over drive acts on the probe 10, both arm portions 12, 14 are elastically deformed and curved without breaking.

Figure 5:
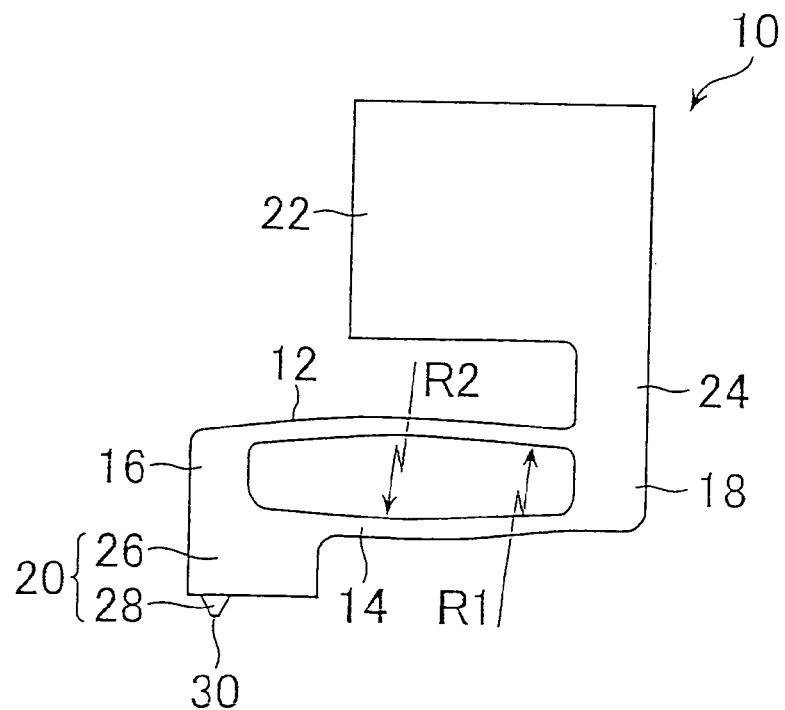
FIG. 5 is a front elevation showing a fifth embodiment of the probe according to the present invention.
Figure 6:
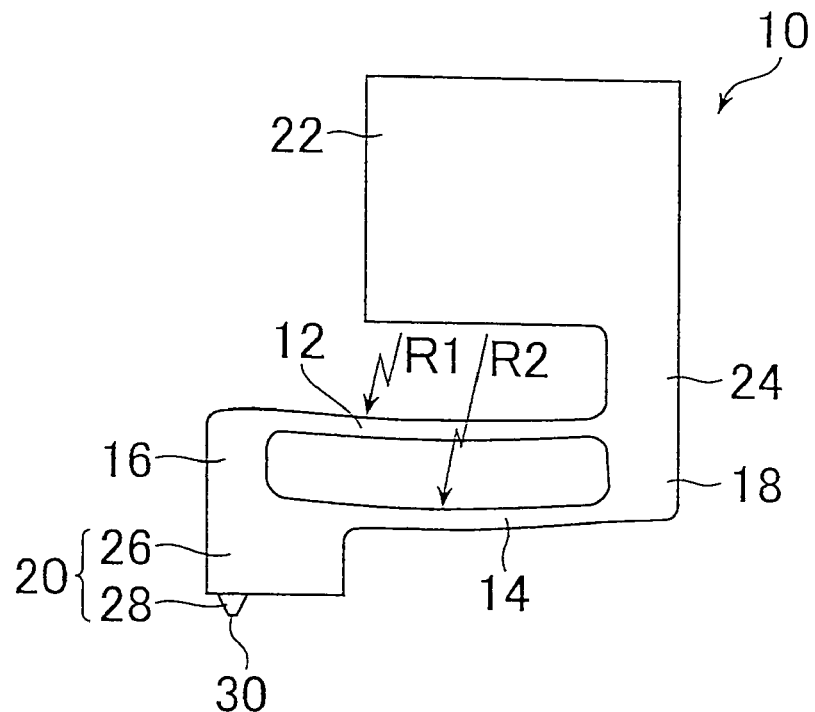
FIG. 6 is a front elevation showing a sixth embodiment according to the present invention.

As shown in FIG. 4, the first and second arm portions 12 and 14 may be curved into an arc shape projecting upward with proper radii of curvature R1 and R2, or as shown in FIG. 5, the second arm portion 14 may be curved into an arc shape projecting downward with the proper radius of curvature R2, or further as shown in FIG. 6, the first and second arm portions 12 and 14 may be curved into an arc shape projecting downward with proper radii of curvature R1 and R2.

In any of the probes shown in FIGS. 4, 5 and 6, mechanical strength of the second arm portion 14 becomes greater, so that even if a great over drive acts on the probe 10, both arm portions 12, 14 tend to be easily elastically deformable without breaking.

Figure 7:
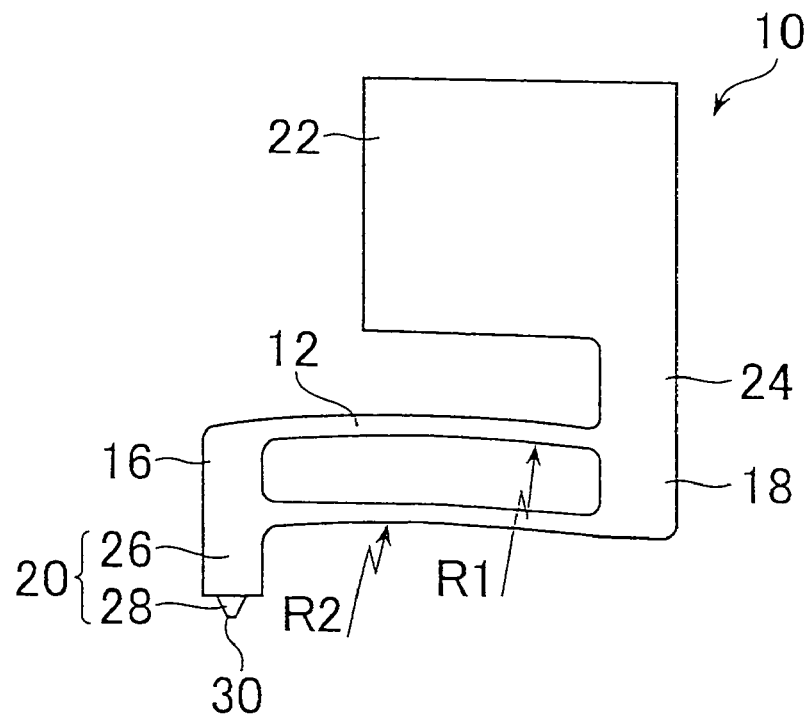
FIG. 7 is a front elevation showing a seventh embodiment according to the present invention.

In any of the above embodiments, the width dimension of the pedestal portion 26 in the rightward and leftward direction may be made the same as the width dimension of the first connecting portion 16 in the rightward and leftward direction, or as shown in FIG. 7, the length dimension of the first and second arm portions 12 and 14 in the rightward and leftward direction may be made the same. In particular, according to the latter, the second arm portion 14 is easily elastically deformed, so that even if a great over drive is made to act on the probe 10, both arm portions 12, 14 are more surely elastically deformed without breaking.

Figure 8A:
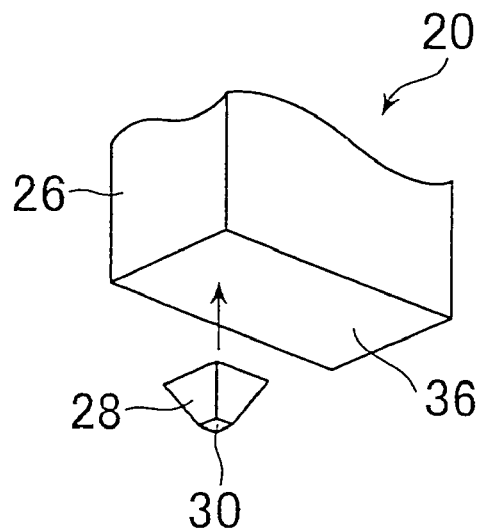
Figure 8B:
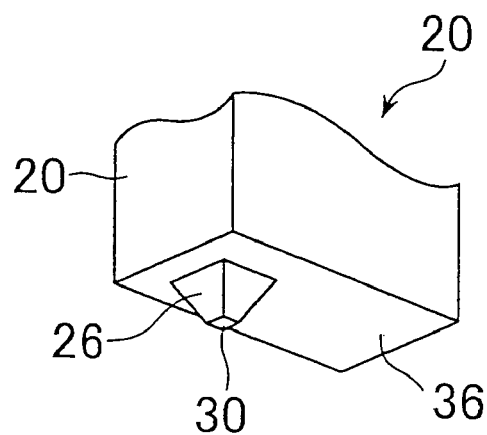

In any of the above embodiments, in place of integrally forming the contact portion 28 on the underside of the pedestal portion 26 at a corresponding position on its conical or pyramidal bottom face, it is possible, as shown in FIGS. 8A and 8B, to make the contact portion 28 independently at least from the pedestal portion 26 and adhere the contact portion 28 to the underside 36 of the pedestal portion 26 by a conductive adhesive such as solder at a position corresponding to the conical or pyramidal bottom face.

Figure 9A:
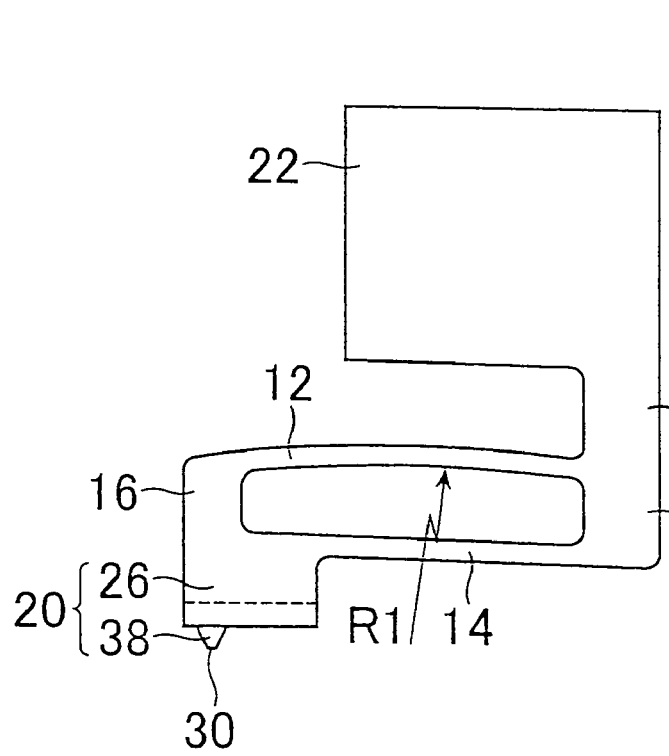
Figure 9B:
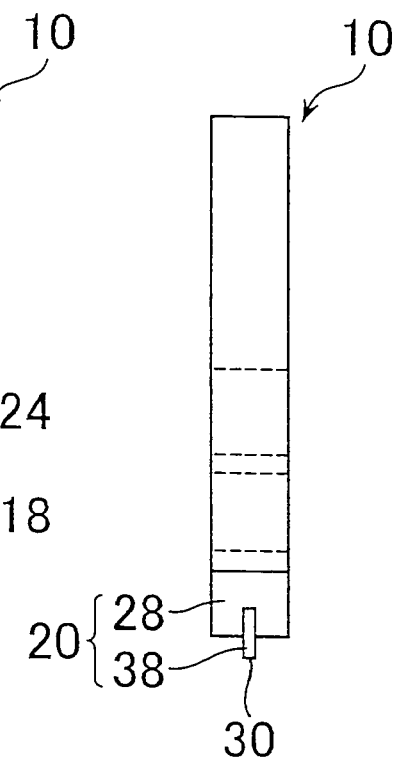

As shown in FIGS. 9A and 9B, it may be a plate-like contact portion 38 having a trapezoidal shape generally with the same thickness. The probe 10 shown in FIGS. 9A and 9B can be made as shown in FIGS. 10A-10F.

Figure 10A:
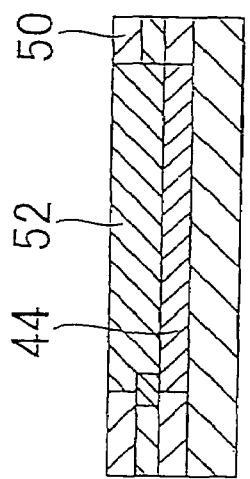
Figure 10B:
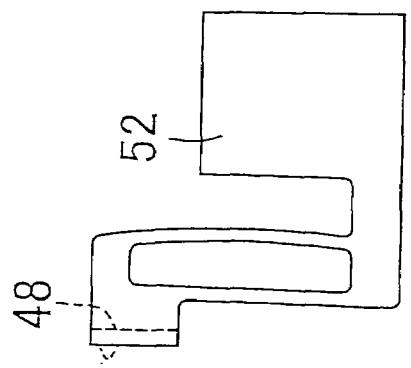

Firstly, as shown in FIGS. 10A and 10B, a plate 40 is prepared, a photoresist 42 is applied to the plate 40, a region of the photoresist 42 corresponding to a probe region other than the contact portion 38 is exposed and developed, a recess is formed in the exposed and developed region, and a conductive metal material is filled in the recess by electroplating using electroforming.

Figure 10C:
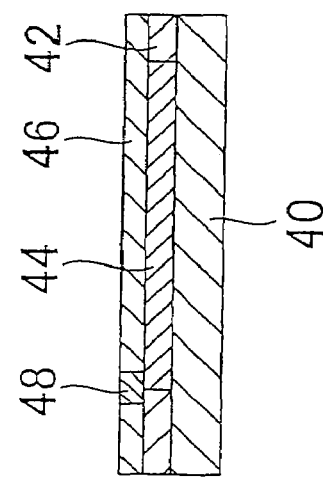
Figure 10D:
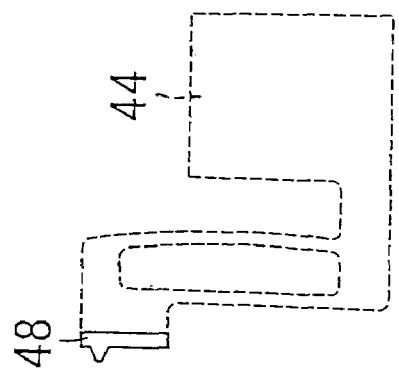

Next, as shown in FIGS. 10C and 10D, a photoresist 46 is applied to the photoresist 42 and a filler 44, a region of the photoresist 46 corresponding to a front end region including the contact portion 38 is exposed and developed, a recess is formed in the exposed and developed region, and a conductive metal material is filled in the recess by electroplating using electroforming.

Figure 10E:
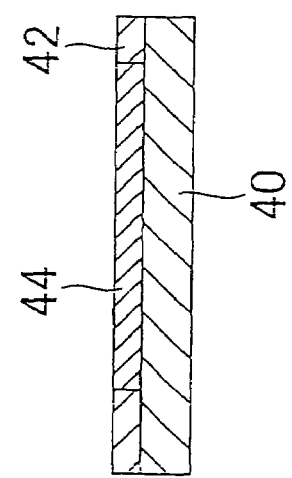
Figure 10F:
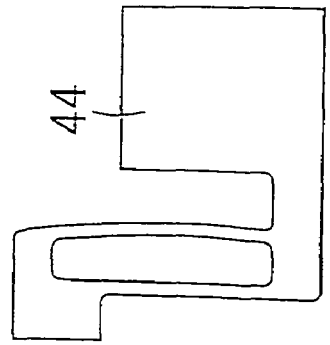

Then, as shown in FIGS. 10E and 10F, a photoresist 50 is applied to the photoresist 46 and a filler 48, a region of the photoresist 50 corresponding to a probe region other than the contact portion 38 is exposed and developed, a recess is formed in the exposed and developed region in the photoresists 46 and 50, and a conductive metal material is filled in the recess by electroplating using electroforming.

Thereafter, all the photoresists 42, 46 and 50 are removed, the probe 10 integrated with fillers 44, 48 and 52 is detached from the plate 40.

Figure 11:
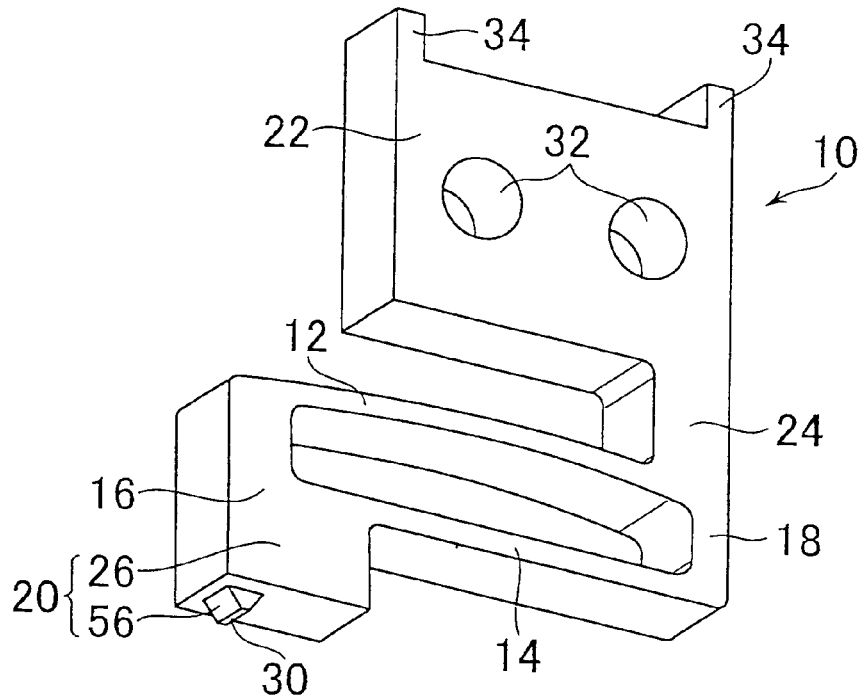
FIG. 11 is a perspective view showing a ninth embodiment of the probe according to the present invention.

In place of making the contact portion 28 conical or pyramidal, a semi-cylindrical contact portion 56 elongated in the thickness direction of the probe 10 as shown in FIG. 11 may be used. The contact portion 56 has a trapezoidal shape as viewed from the thickness direction of the probe 10. The probe 10 with the contact portion 56 can be also made easily by conducting several times exposing and developing of the photoresist and electroplating such as mentioned above.

The probe for electric test is generally positioned to the prober or device under test in a state of being disposed on the prober. For this reason, an image of the probe 10 is picked-up by an area sensor from the side (side of the device under test) of the needle point 30. The position of each probe 10 is obtained as a coordinate position of the needle point 30 within an image picking-up region of the are a sensor by image-processing an output signal of the area sensor.

Figure 12A:
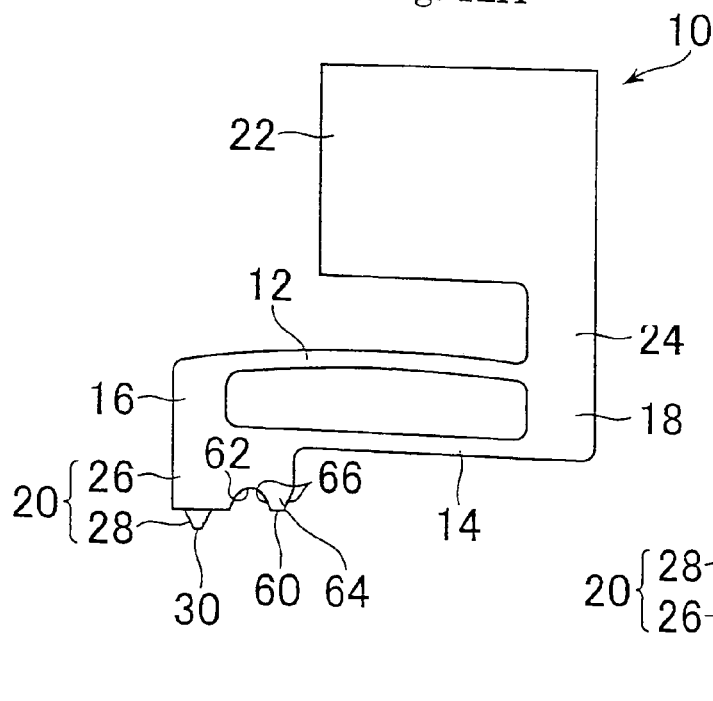
FIGS. 12A and 12(B are views showing a tenth embodiment of the probe according to the preset invention, wherein FIG. 12A is a front elevation and FIG. 12B a bottom view of the needle point portion.
Figure 12B:
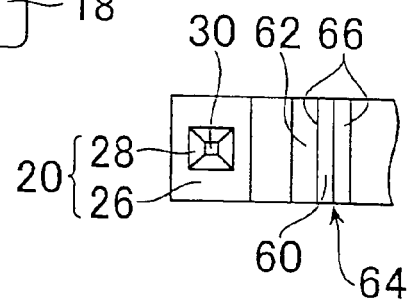

Therefore, the probe 10 has a reference portion 60, as shown in FIG. 12, at a position different from that of the needle point 30. The reference portion 60 shown in FIG. 12 forms a recess 62 on the underside of the pedestal portion 26 and forms a projecting portion 64 projecting downward from the pedestal portion 26 and is made a flat face portion of the lower end of the projecting portion 64.

The projecting portion 64 extends in the thickness direction of the probe 10 and is made to have a trapezoidal cross section by the flat face portion, i.e., reference portion 60 and a pair of right and left inclined plane portion 66 which is inclined to the axis of the projecting portion 64.

The reference portion (flat face portion) 60 follows the front ends of both inclined plane portions 66 and is made perpendicular to the axis of the projecting portion 64, and retreated toward the arm portion 14 than toward the needle point 30, and further shaped like a strip extending in the thickness direction of the probe 10.

When positioning relative to the prober or the device under test, the image of the probe 10 is picked-up by the area sensor from the side (side of the device under test) of the needle point 30. The position of the probe 10 is obtained as a coordinate position of the needle point within the image picking-up region of the area sensor by image-processing an output signal of the area sensor.

Since the probe 10 shown in FIG. 12 has the reference portion 60 formed at a position different from that of the needle point 30, it is possible to distinguish the reference portion 60 easily from the surroundings by using an output signal of the area sensor, thereby enabling to determine easily the coordinate position of the reference portion 60. Also, since the positional relation between the reference portion 60 and the needle point 30 is constant, the position of the needle point 30 can be easily determined from the position of the reference portion 60.

The reference portion 60, being the flat face portion, has a downward light reflection property different from at least a part of the neighboring region. For this reason, it is possible to determine the reference portion 60 easily by utilizing a difference in the amount of downward reflection light.

Figure 13A:
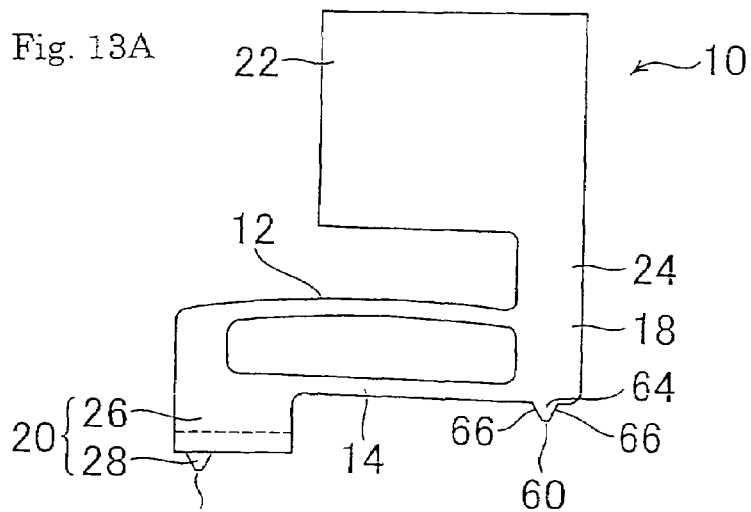
Figure 13B:
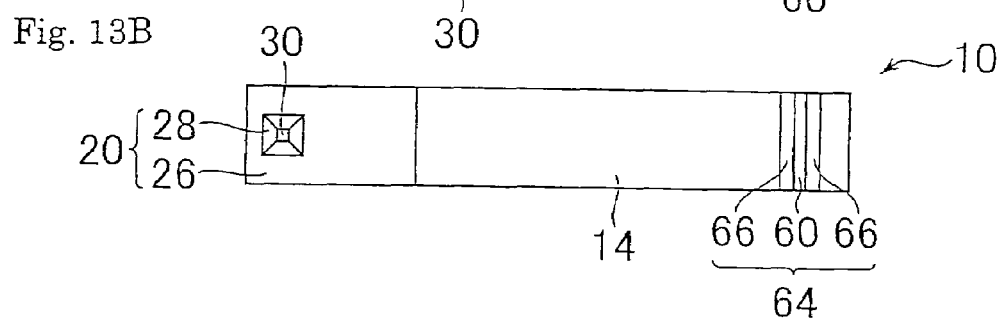

Referring to FIG. 13, the probe 10 has the projected portion 64 projected downward from the right end portion of the arm portion 14, making the flat face portion at the lower end of the projected portion 64 the reference portion 60.

Figure 14A:
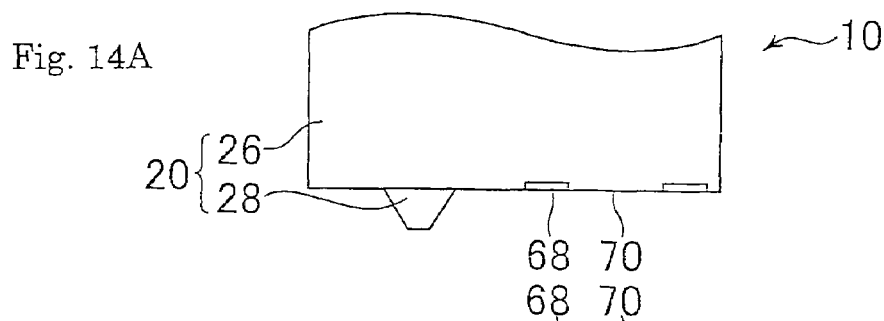
Figure 14B:
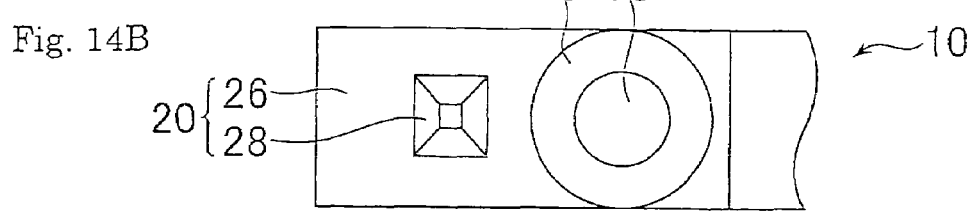
Figure 15:
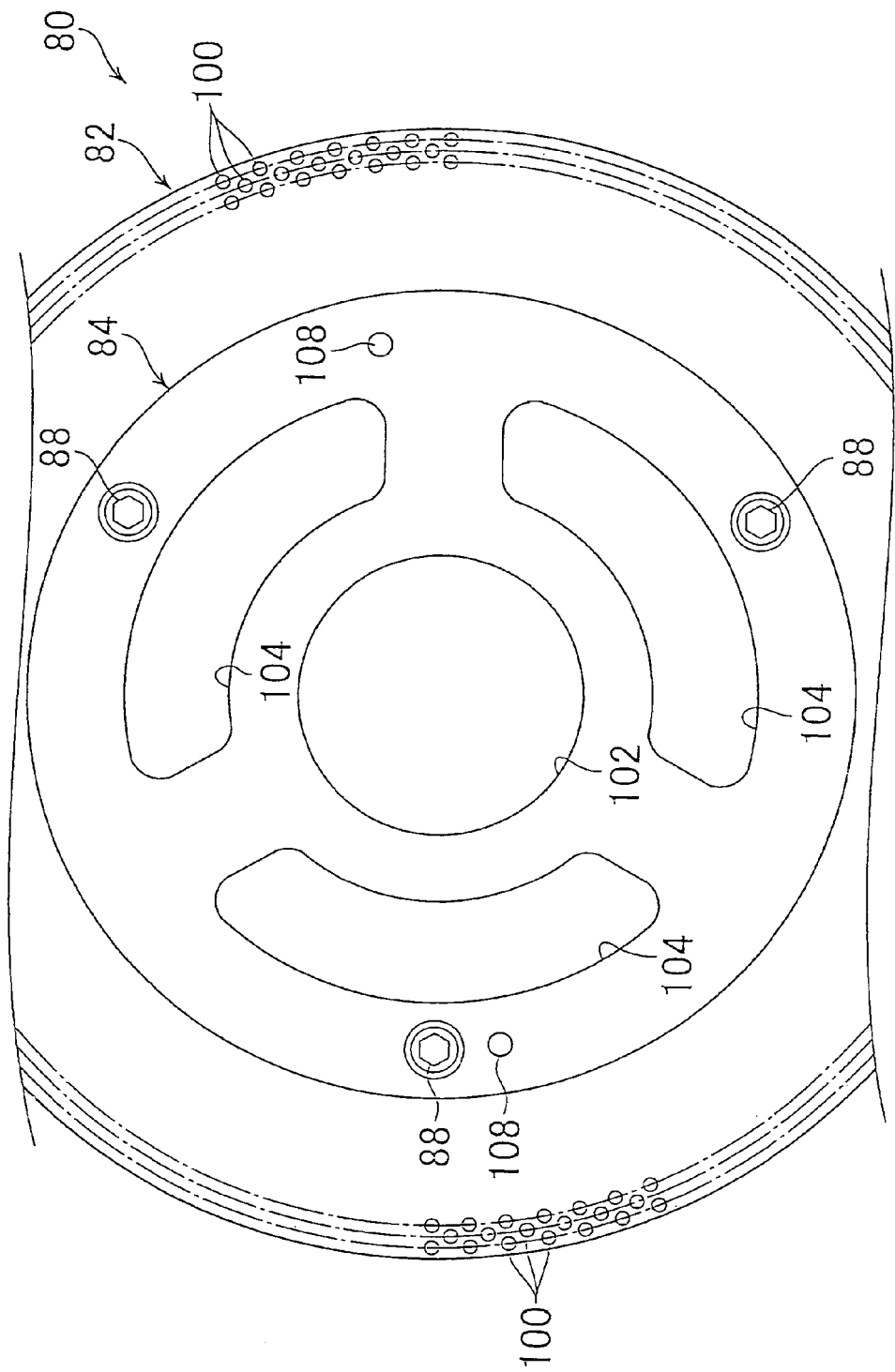
FIG. 15 is a plan view showing one embodiment of an electric connecting apparatus using the probe according to the present invention.
Figure 16:
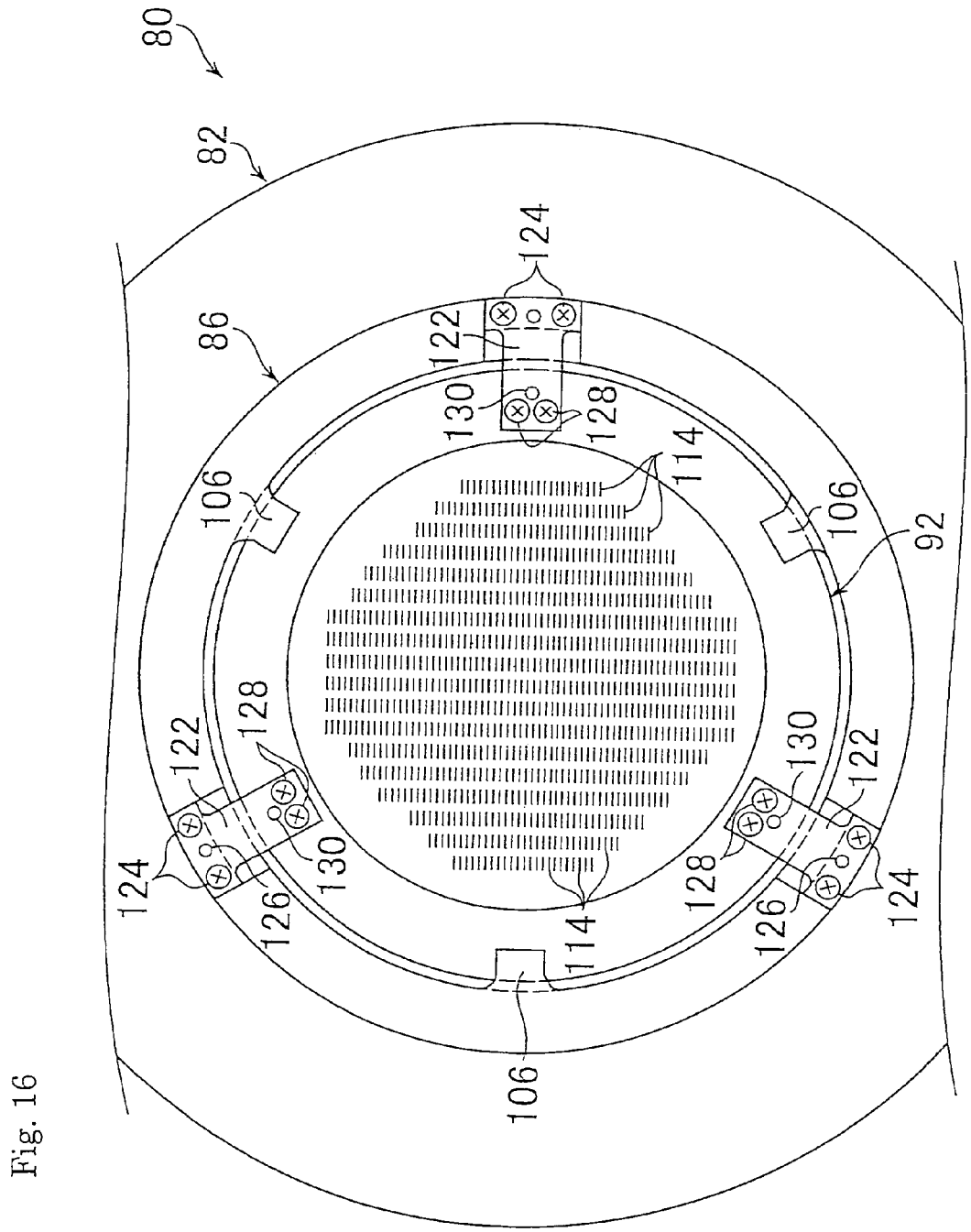
FIG. 16 is a bottom view of the electric connecting apparatus shown in FIG. 15.
Figure 17:
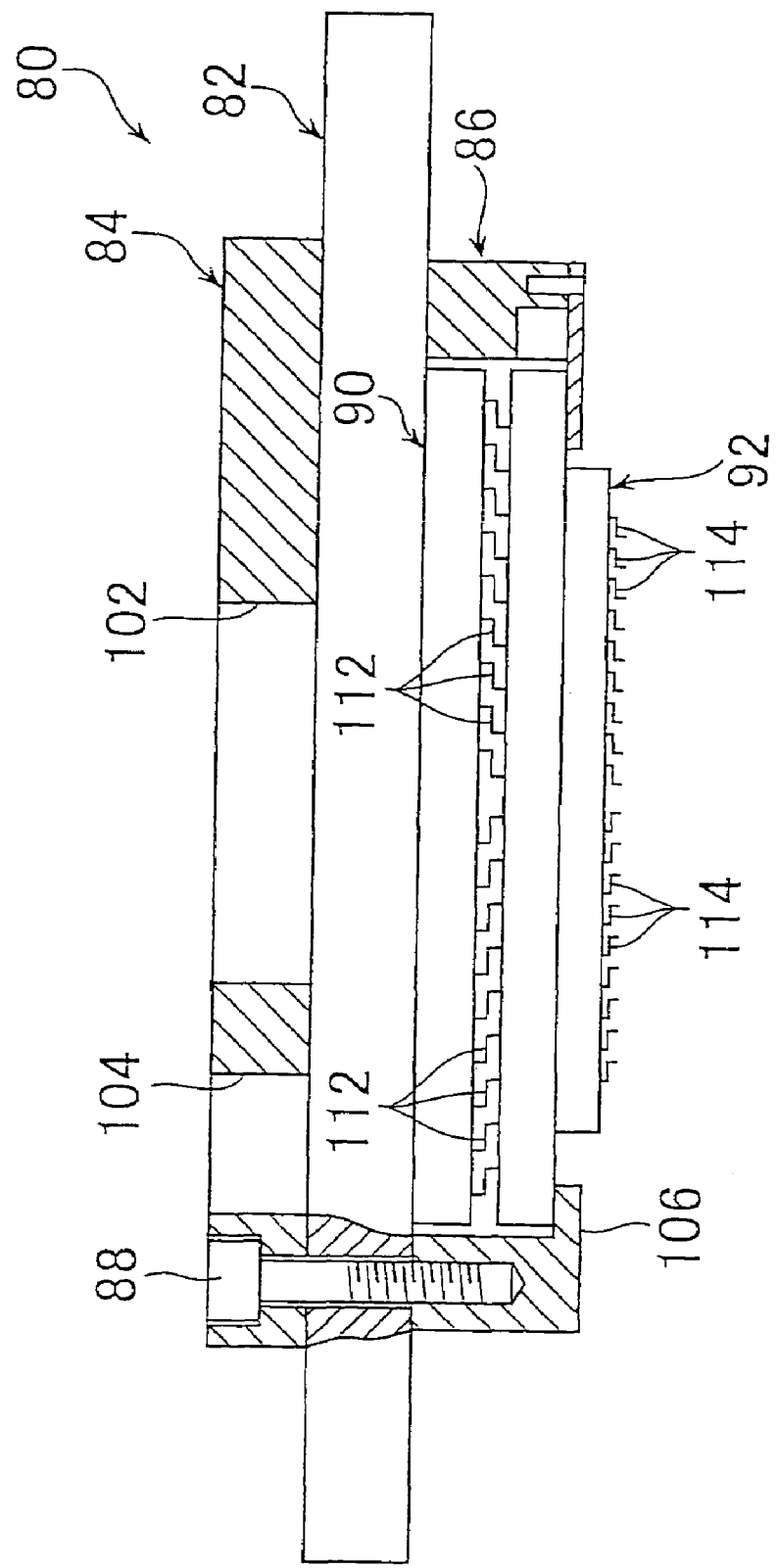
FIG. 17 is a view showing a reinforcing plate and a ring sectioned vertically of the electric connecting apparatus shown in FIG. 15.
Figure 18:
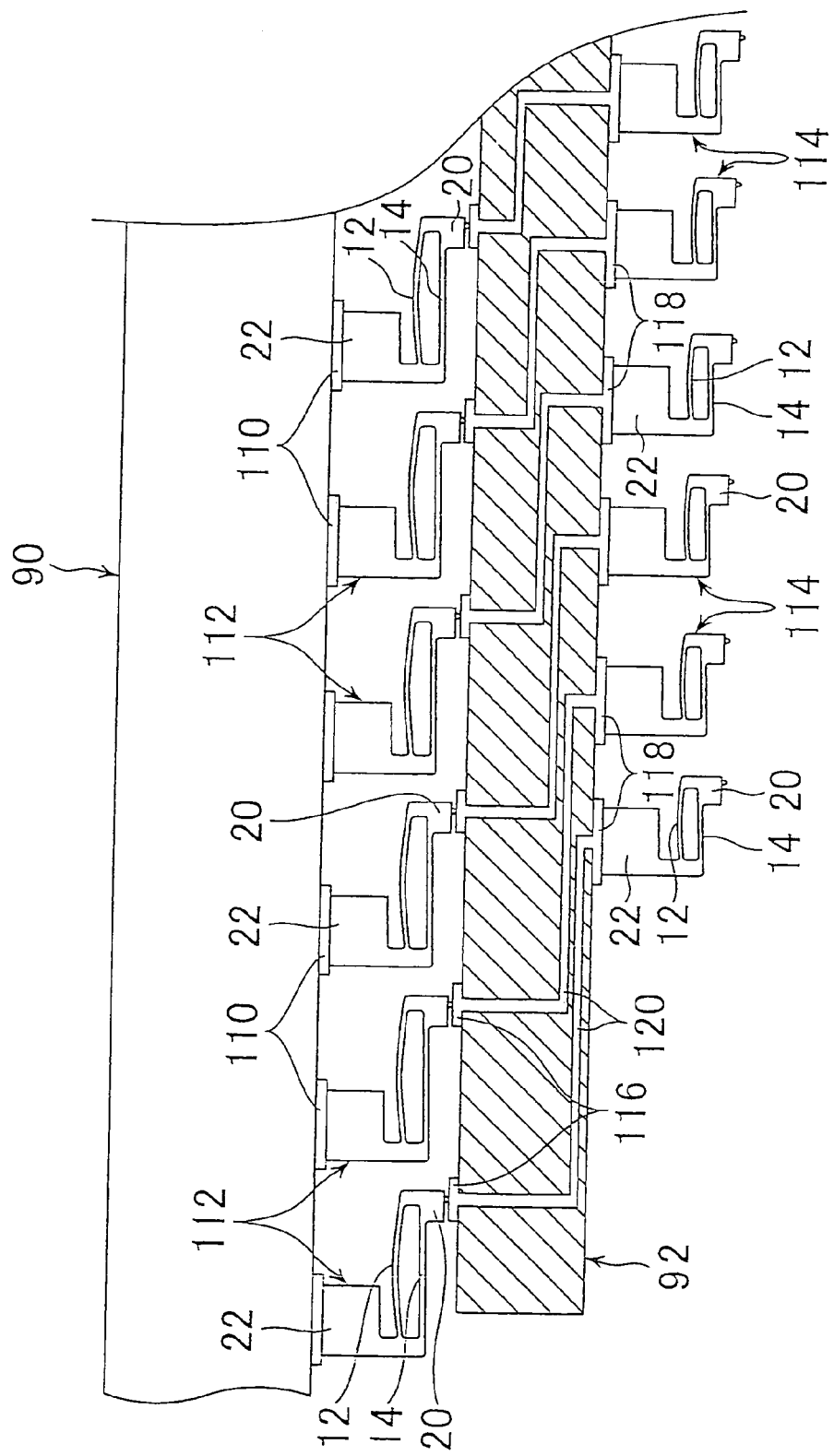
FIG. 18 is a view showing a part of a connection plate and a mounting plate partially enlarged in the electric connecting apparatus shown in FIG. 15.

Referring to FIG. 14, the probe 10 forms a surrounding region 68 on the underside of the pedestal 26, making the region inside the surrounding region 68 a reference portion 70. The reference portion 70 is higher in the downward light reflection property than the surrounding region 68 and is a flat face. The surrounding region 68 is made a coarse face to reflect a light irregularly.

While the surrounding region 68 is circular in the illustration, it may have another shape, such as a triangle, a rectangle or an asterisk. Also, the surrounding region 68 and the reference portion 70 may be formed on the underside of the arm portion 14 instead of the pedestal portion 26.

The reference portions 60 and 70 may be made acute portions in place of flat faces. Also, it suffices that the reference portions 60 and 70 differ in the downward light reflection property from that of the surrounding or neighboring region 66, 68. Accordingly, the reference portions 60 and 70 may be made larger or smaller than the surrounding or neighboring region 66, 68 in the downward light reflection property.

Both of the probes 10 shown in FIGS. 13 and 14 bring about the same action and effect as the probe shown in FIG. 12.

It suffices that the reference portion 60 or 70 of any probe 10 shown in FIGS. 12, 13 and 14 has higher or lower light reflection property than its neighboring region, but it is preferable that the light reflection properties be greatly different between the reference portion 60 or 70 and its neighboring region. Therefore, the reference portion 60 or 70 may be made a flat face and its surrounding region may be made an inclined plane inclined to the reference portion, an irregular light-reflection plane, a low light-reflection plane, etc.

While in any of the above embodiments, the whole of the arm portion 12 or 14 is curved in an arc-like shape, it is possible to make at least one of the edge portion on one side in the upward and downward direction of the arm portion 12 or 14 and the edge portion on the other side in the upward and downward direction of the arm portion 12 or 14 may be made arcuate.

Any probe shown in FIGS. 1-7 and FIGS. 11-14 can also be produced like the probe shown in FIG. 7 by the technique shown in FIG. 8.

In the following, embodiments of an electric connecting apparatus using the above-mentioned probe are explained.

Referring to FIGS. 15-19, as already mentioned, an electric connecting apparatus 80 has a circular wiring plate 82, a circular reinforcing plate 84 disposed on the top face of the wiring plate 82, and a ring 86 disposed on the underside of the wiring plate 82 coaxially attached with a plurality of bolts 88 in an overlapped state. Inside the ring 86, a circular connecting plate 90 and a mounting plate 92 are disposed on the underside of the wiring plate 82.

The wiring plate 82 is provided at the peripheral edge portion of the top face a plurality of tester lands 100 connected to an electric circuit of a tester, and though not shown, a plurality of wiring portions individually connected to the tester lands on the underside or the inside.

The reinforcing plate 84 has a circular hole 102 at the central portion and a plurality of crescent-shaped holes 104 provided therearound. The ring 86 has a plurality (three in the drawing) of plate-like holding portions 106 extending horizontally from the lower end edge toward the center so as to receive the mounting plate 92 in the inside at equal angular intervals about the axis of the ring 86.

The wiring plate 82, the reinforcing plate 84 and the ring 86 are positioned relatively by a plurality of positioning pins 108 penetrating them in the thickness direction.

The connecting plate 90 has a plurality of first connection lands 110 formed on its underside, solders a plurality of connection members 112 individually to the first, connection lands 110, and connects the connection lands 110 to the wiring portions of the wiring plate 82 by a plurality of wiring portions (not shown).

The connecting plate 90 is attached to the wiring plate 82 in a state of being pressed against the wiring plate 82 with proper fasteners such as bolts. The wiring plate 82, the ring 86 and the connection plate 90 constitute a support plate for probes 114. The connection plate 90 may be integrated with the wiring plate 82.

Each connection member 112 in the drawing is the probe shown in FIGS. 1A and 1B or FIGS. 2A and 2B, and is soldered in a cantilever-like manner to the corresponding first connection land 110 at the mounting portion 22 such that a needle point portion 20 faces downward and that the arm portions 12, 14 extend in the rightward and leftward direction.

The mounting plate 92 has a circular flange portion formed in the outer peripheral portion of the upper end of its circular body portion, and a plurality of probes 114 attached to the underside. The mounting plate 92 is provided with a plurality of second connection lands 116 to be pressed individually against the connection members 112, and a plurality of wiring portions 120 connecting the second connection lands 116 and probe seats 118 in one-to-one correspondence.

Each probe 114 is the probe shown in FIGS. 1A and 1B or FIGS. 2A and 2B, and is soldered in a cantilever-like manner to the corresponding probe seat 118 at the mounting portion 22 such that the needle point portion 20 faces downward and that the arm portions 12, 14 extend laterally.

The mounting plate 92 is incorporated into the ring 86 by a plurality (three in the drawing) of positioning plates 122 attached at equal angular intervals to the underside of the ring 86 with bolts 124 in a state of being placed on the holding portion 106 with the second connection lands 116 pressed against the needle point portions 20 of the corresponding connection members 112.

Each positioning plate 122 is positioned relative to the ring 86, in turn, to the wiring plate 82 with a positioning pin 126. Each positioning plate 122 can be a spring leaf so as to energize the mounting plate 92 toward the connection plate 90 or to elastically deform when the probe 114 is pressed against the device under test 94.

The mounting plate 92 is mounted on the top face of the positioning plate 122 with a plurality of bolts 128 and positioned relative to each positioning plate 122 with a positioning pin 130.

The mounting plate 92 is energized toward the holding portion 106 by means of the connection members 112, thereby being relatively pressed against each second connection land 116 and the needle point portion 20 of the corresponding connection member 112.

The positioning plate 122 is positioned at equal angular intervals about the axis of the ring 86, thereby making the pressing forces of the second connection lands 116 against the connection members 112 the same.

Instead of attaching the probe-like connection members 112 to the first connection land 110 such that the needle points 20 are projected downward, they may be attached to the second connection land 116 such that the needle points 20 are projected upward to be brought into contact with the first connection land 110.

Figure 19:
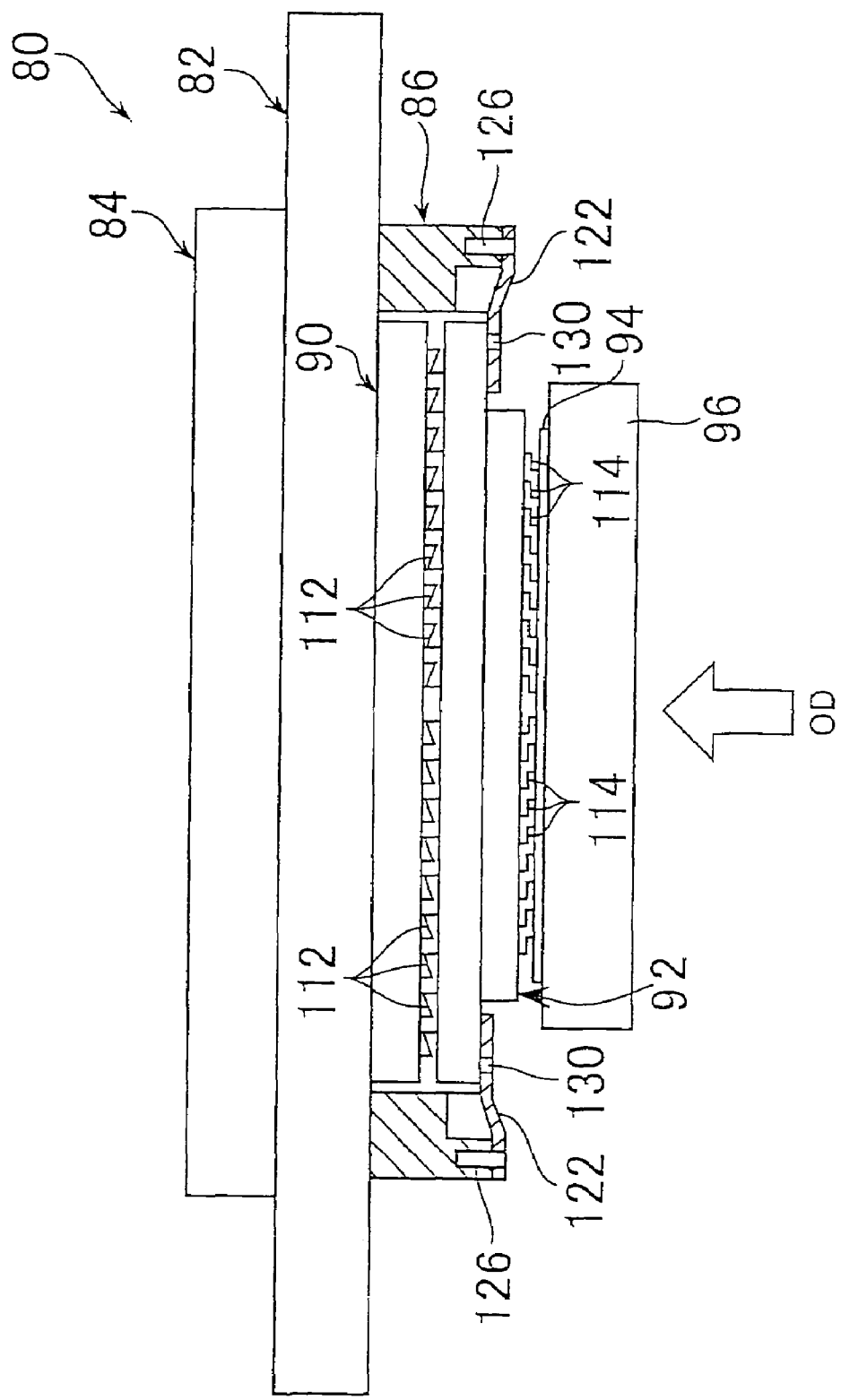
FIG. 19 is a view showing a state of relatively pressing the probe and a device under test in the electric connecting apparatus shown in FIG. 15.

The electric connecting apparatus 80 has the needle point 30 of each probe 114 pressed against the electrode of the device under test 94, as shown in FIG. 19. By this, the over drive acts on each probe 114, and both arm portions 12, 14 are elastically deformed and curved.

A plurality of probe-like connection members 112 disposed in a cantilever-like manner between the connection plate 90 and the mounting plate 92 are, as shown in FIG. 19, curved at the cantilever-like arm portions 12, 14 when the probe 114 and the device under test 94 are pressed, and absorb a part of the force to be transmitted to the connection plate 90, in turn, to the wiring plate 82 when the probe 114 and the device under test 94 are pressed. This reduces the force to be transmitted to the connection plate 90 and the wiring plate 82 when the probe 114 and the device under test 94 are pressed.

In particular, as the connection member 112 and probe 114, if, like the probes shown in FIGS. 1 through 14, the probe 10 of which one of the arm portions 12, 14 is made arcuate at least at the whole of the arm portion, the upper edge portion of the arm portion, and the lower edge portion of the arm portion is used, the mechanical strength of the arm portion having an arcuate portion becomes great as mentioned above, so that even if a great over drive acts on the probe, both arm portions are elastically deformed and curved without breaking.

As a result, since, by making the amount of over drive great, the pressing force (needle pressure) of the needle points against the electrode of the device under test 94 can be made great, the electrode of the device under test 94 and the needle point can be rendered into a state of favorable electric connection, and the electrode of the device under test 94 and the needle points can be surely brought into contact without making the positions of the needle points in the upward and downward direction coincide with high accuracy, which results in an accurate testing.

Figure 20:
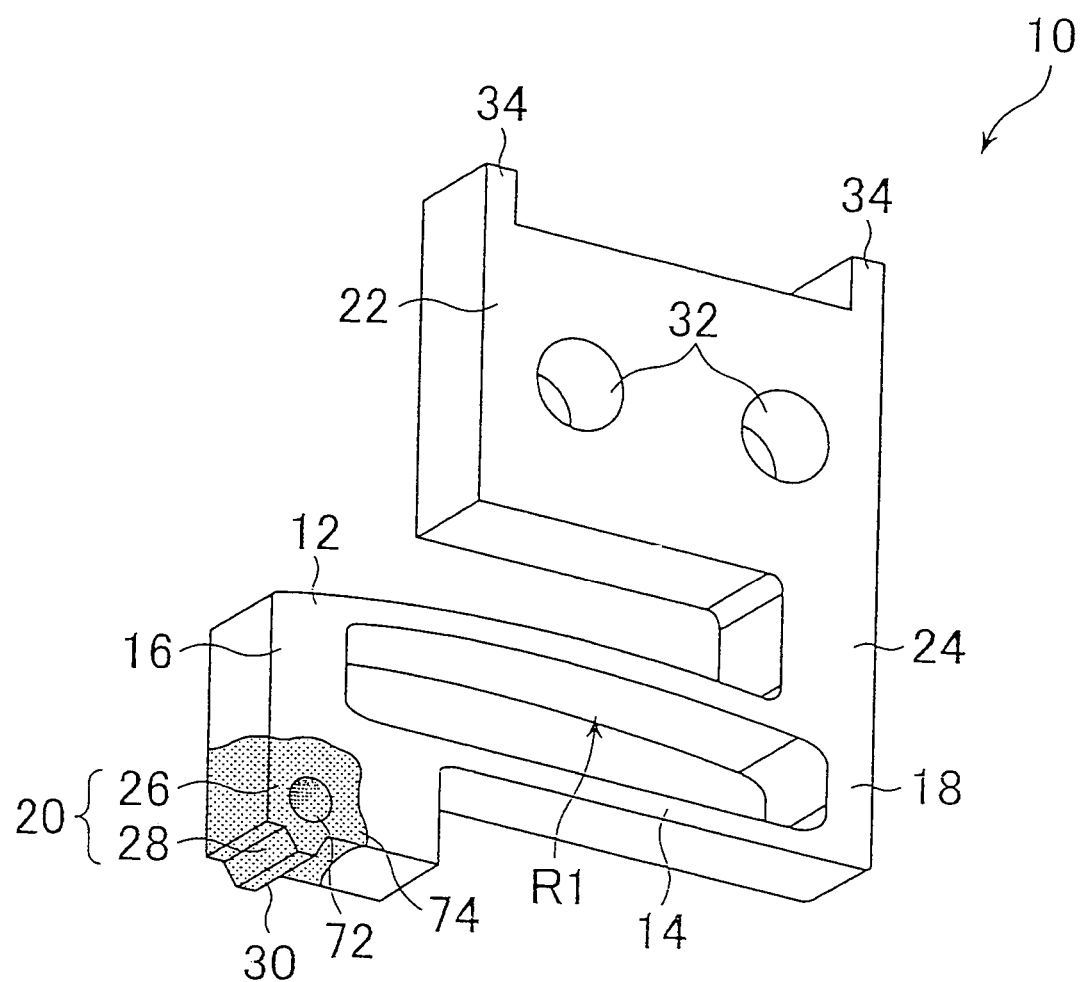
FIG. 20 is a perspective view showing a thirteenth embodiment of the probe according to the present invention.

Referring to FIG. 20, the probe 10 further includes the recess 72 formed in the pedestal portion 26 of the needle point portion 20, and the conductive coat 74 formed in a region containing the recess 72 and the needle point 30 of the needle point portion 20.

Though the recess 72 is shown as a hole penetrating the pedestal portion 26, it may be a bottomed hole. In that case, such bottomed holes may be formed at a plurality of positions such as both faces in the thickness direction of the pedestal portion 26, at the front end face and the rear end face of the pedestal portion 26, the bottom face of the pedestal portion, etc.

The coat 74 may be formed not only in such a region as mentioned above, but also on the whole body of the needle point portion 20, or in a region including the above-mentioned region and another region containing the whole needle point portion 20, the arm portion 14 and the connecting portion 16, the entire probe.

According to the probe having the coat 74, by making the coat 74 of a harder material than other portions such as the needle point portion 20, ware of the needle-point 30 can be reduced. Also, since the coat 74 is formed in the recess 72, too, the coat 74 is prevented from peeling off the needle point portion 20 even if, due to an over drive at the time of an electric test, the needle point 30 slides relative to the electrode in a state of being pressed against the electrode of the device under test.

The present invention is not limited to the above embodiments but can be variously modified without departing from its purport.

The invention claimed is:

1. A probe for testing an electrical device, comprising:
   (a) a mounting portion to be mounted on a base plate at an upper end portion of the probe;
   (b) an extended portion extending from an underside of the mounting portion;
   (c) an arm extending in a lateral direction from a lower end portion of the extended portion; wherein the arm includes first and a second arm portions and first and second connecting portions connecting said first and second arm portions respectively at their front end portions and base end portions, wherein the first and second arm portions extend laterally from the second connecting portion in a spaced-apart manner; and
   (d) a needle point portion positioned on an underside of the first connecting portion or the second arm portion of the arm;
   wherein the first and second arm portions are arc-shaped such that at least one of the entire first and second arm portions, the entire upper edge portions of the first and second arm portions, or the entire lower edge portions of the first and second arm portions are arcuate in the same direction.

2. A probe as claimed in claim 1, wherein said probe is generally flat in configuration, and wherein the mounting portion, extended portion, and arm have substantially the same thickness.

3. A probe as claimed in claim 2, wherein said mounting portion has holes penetrating in its thickness direction.

4. A probe as claimed in claim 1, further comprising a projection extending from an upper side of said mounting portion.

5. A probe as claimed in claim 1, wherein said needle point portion further comprises:
   a pedestal portion extending from said first connecting portion and said second arm portion; and
   a contact portion projecting from a lower portion of said pedestal portion.

6. A probe as claimed in claim 5, wherein said contact portion is made of a material different from that of at-least said pedestal portion.

7. A probe as claimed in claim 6, wherein said pedestal portion is made of the same material as said first and second arm portions and said first and second connecting portions.

8. A probe as claimed in claim 6, wherein said contact portion has a front end face which has an angle of 0.1° to 5° with respect to said lateral direction.

9. A probe as claimed in claim 1, further comprising a reference portion formed at a position different from a needle point of said needle point portion.

10. A probe as claimed in claim 9, wherein said reference portion has a downward light reflection property with respect to the underside of the first connecting portion or the second arm portion of the arm which is different from that of a neighboring portion of the needle point portion.

11. A probe as claimed in claim 9, further comprising a projected portion projecting downwardly from either one of said needle point portion or said second arm portion, wherein said projected portion is provided with at least one inclined plane portion inclined with respect to the axis of said projected portion and with a flat plane portion at a distal end of said inclined plane portion which is perpendicular to said axis and wherein said reference portion is said flat plane portion.

12. A probe as claimed in claim 11, wherein said projected portion is projected from said needle point portion.

13. A probe as claimed in claim 9, wherein said reference portion is surrounded by a surrounding region which differs in a light reflection property from the downward light reflection property of said reference portion.

14. A probe as claimed in claim 1, further comprising at least one recess formed in said needle point portion, and a conductive coat formed in a region including said recess and the needle point of said needle point portion.

15. A probe for testing an electrical device, comprising:
(a) an arm comprising first and a second arm portions and first and second connecting portions connecting the first and second arm portions respectively at their front end portions and base end portions, wherein the first and second arm portions extend laterally from the second connecting portion in a spaced-apart manner;
(b) a needle point portion positioned on an underside of the first connecting portion or the second arm portion of the arm, wherein the needle point portion comprises a needle point;
(c) a reference portion formed in the needle point portion at a position different from the position of the needle point; and
(d) a projected portion projecting downwardly from one of the needle point portion or the second arm portion, wherein the projected portion is provided with at least one inclined plane portion inclined with respect to the axis of the projected portion and with a flat plane portion at a distal end of the inclined plane portion which is perpendicular to the axis, and wherein the reference portion is the flat plane portion.

* * * * *